United States Patent
Xu et al.

(10) Patent No.: US 8,284,860 B2
(45) Date of Patent: Oct. 9, 2012

(54) ERROR SIGNAL PROCESSING SYSTEMS FOR GENERATING A DIGITAL ERROR SIGNAL FROM AN ANALOG ERROR SIGNAL

(75) Inventors: Bing Xu, Gilbert, AZ (US); Daniel B. Schwartz, Scottsdale, AZ (US); Clive K. Tang, Chandler, AZ (US)

(73) Assignee: Freescale Semiconductors, Inc., Austin, TX (US)

( * ) Notice: Subject to any disclaimer, the term of this patent is extended or adjusted under 35 U.S.C. 154(b) by 954 days.

(21) Appl. No.: 12/262,575

(22) Filed: Oct. 31, 2008

(65) Prior Publication Data

US 2010/0111238 A1    May 6, 2010

(51) Int. Cl.
  *H04L 25/49* (2006.01)
  *H04B 1/04* (2006.01)
(52) U.S. Cl. ........ 375/296; 375/297; 375/316; 375/318; 375/317; 375/319; 455/114.3; 455/114.2
(58) Field of Classification Search ............... 375/211, 375/219, 222, 221, 295, 296–297, 311, 310, 375/312, 316, 317, 318, 285, 319, 345, 344, 375/346, 354, 355, 356, 357, 358, 362; 330/252–254, 278–279; 455/91, 95, 114.2, 455/114.3, 115.1, 127.1, 127.2, 127.3, 130, 455/182.2, 192.2, 194.2, 195.1, 239.1, 245.1, 455/241.1, 245.2, 250.1, 253.2
See application file for complete search history.

(56) References Cited

U.S. PATENT DOCUMENTS

| | | | |
|---|---|---|---|
| 5,276,685 A * | 1/1994 | Kepler et al. ............. | 370/332 |
| 6,600,792 B2 | 7/2003 | Antonio et al. | |
| 7,058,369 B1 | 6/2006 | Wright et al. | |
| 7,085,330 B1 | 8/2006 | Shirali | |
| 7,215,972 B2 | 5/2007 | Premakanthan et al. | |
| 7,471,739 B1 * | 12/2008 | Wright ..................... | 375/297 |
| 2002/0041208 A1 * | 4/2002 | Hamada et al. ........... | 330/149 |
| 2003/0198306 A1 * | 10/2003 | Forrester .................. | 375/345 |
| 2006/0208933 A1 * | 9/2006 | Chen et al. ............... | 341/120 |
| 2008/0111726 A1 * | 5/2008 | Landolt ................... | 341/159 |
| 2010/0069005 A1 * | 3/2010 | Haartsen .................. | 455/41.3 |

* cited by examiner

*Primary Examiner* — Sam K Ahn
*Assistant Examiner* — Linda Wong
(74) *Attorney, Agent, or Firm* — Ingrassia Fisher & Lorenz, P.C.

(57) ABSTRACT

Apparatus, systems, and methods are provided for controlling the output of a transmitter using a digital error signal. A method comprises generating a digital reference signal based on a baseband input signal and converting the digital reference signal to an analog reference signal. The method further comprises generating an analog error signal in response to a difference between the analog reference signal and an analog output signal. The method further comprises generating a digital error signal from the analog error signal, and generating an input signal for the transmitter based on the baseband input signal and the digital error signal.

16 Claims, 2 Drawing Sheets

ERROR SIGNAL PROCESSING SYSTEMS FOR GENERATING A DIGITAL ERROR SIGNAL FROM AN ANALOG ERROR SIGNAL

TECHNICAL FIELD

Embodiments of the subject matter described herein relate generally to radio frequency transmitters, and more particularly, embodiments of the subject matter relate to methods and systems for generating error signals used in controlling the power output capability and linearity of power amplifiers.

BACKGROUND

Transmitters or transceivers often use a power amplifier to increase the amplitude of a radio frequency (RF) signal that is provided to an antenna for transmission. In practice, the power amplifier is not perfect, that is, the power amplifier exhibits non-linearities and experiences gain variations, for example, based on changes in ambient temperature or battery voltage. Thus, many transmitter systems implement various closed-loop control techniques, such as output power control or predistortion, to compensate for the non-linearity and gain variation of the power amplifier. In general, these techniques determine an error signal by measuring or sensing the output of the power amplifier and comparing the digitized output of the power amplifier to a digital reference signal based on the baseband input to the transmitter. Based on the error signal, the system adjusts the signal level and/or phase of the input signal to the power amplifier to compensate for any non-linearity of the power amplifier.

Most current systems utilize an analog-to-digital converter to convert the output of the power amplifier to a digital signal for comparison to the digital reference signal. In order to cover the full dynamic range of the output of the power amplifier, the resolution of the analog-to-digital converter is generally around ten to twelve bits or more. As a result, the area and current drain of the analog-to-digital converter limits the ability of a system designer to incorporate these closed-loop power control methods in smaller portable devices, such as cellular phones and other wireless devices, where size and power consumption (or battery life) are at a premium.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

The following description refers to elements or nodes or features being "coupled" together. As used herein, unless expressly stated otherwise, "coupled" means that one element is directly or indirectly joined to (or directly or indirectly communicates with) another element, and not necessarily mechanically. Thus, although the schematics shown in the figures depict exemplary arrangements of elements, additional intervening elements, devices, features, or components may be present in an embodiment of the depicted subject matter.

For the sake of brevity, conventional techniques related to transmitter and transceiver design, baseband programming, sampling, analog-to-digital conversion, digital-to-analog conversion, analog circuit design, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. It should be understood that circuitry described herein may be implemented either in silicon or another semiconductor material or alternatively by software code representation thereof.

Technologies and concepts discussed herein relate to systems and methods for generating a digital error signal for use with adaptive predistortion and automatic output power control systems in transmitters and/or transceivers. A digital reference signal for the amplifier output based on the baseband input signal is converted into an analog reference signal. The difference between the analog reference signal and the demodulated analog output of the power amplifier are compared to determine an analog error value, which is converted to digital and used to generate a digital error signal. The resolution of the analog-to-digital converter is reduced, which reduces the area and current/power demands of the transmitter.

Figure 1:
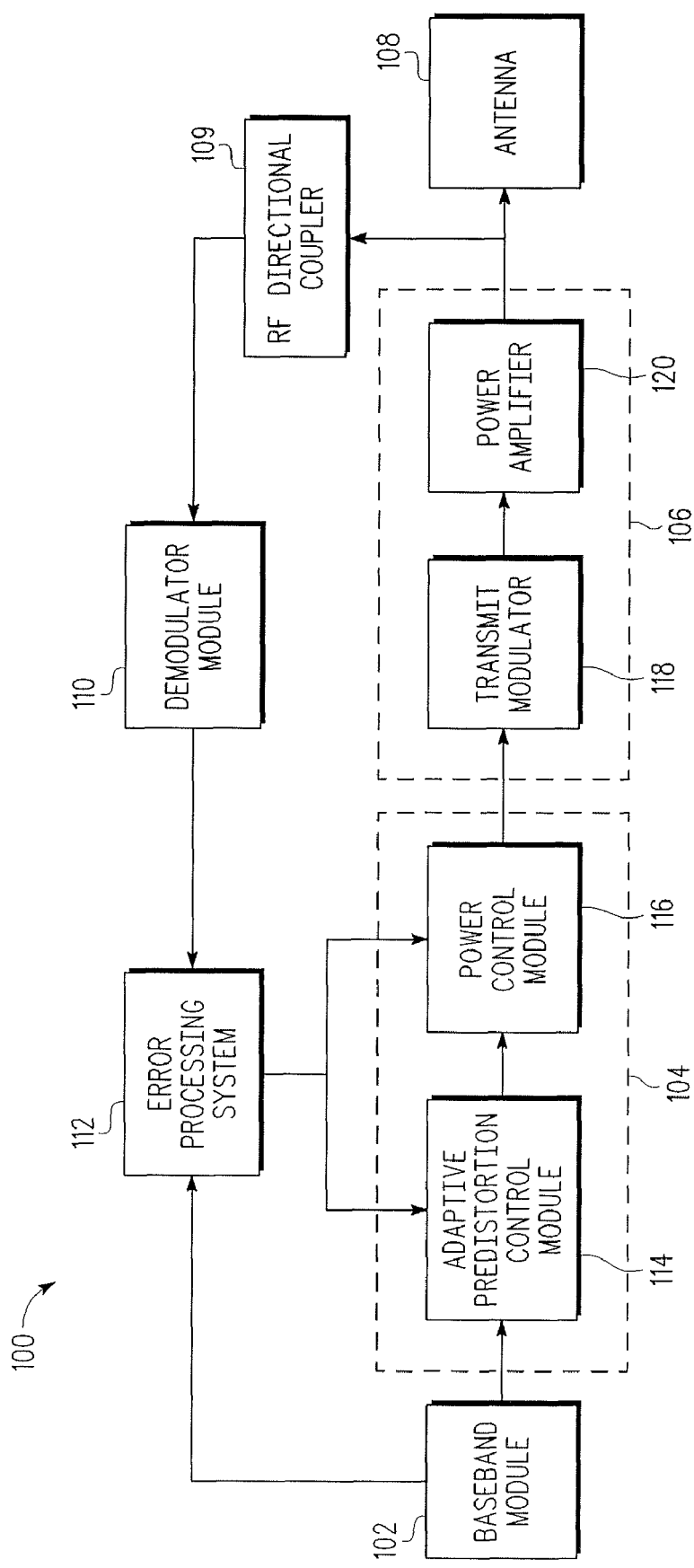
FIG. 1 is a block diagram of a transmitter in accordance with one embodiment of the present invention.

FIG. 1 depicts a transmitter 100 in accordance with one embodiment. In an exemplary embodiment, the transmitter 100 is realized as a radio frequency (RF) transmitter. The transmitter 100 includes, without limitation, a baseband module 102, an output control module 104, a transmission module 106, and an antenna 108. In an exemplary embodiment, a RF directional coupler 109 provides a coupled component of an RF output signal from the transmission module 106 to a demodulation module 110. The demodulation module 110 demodulates the coupled component and provides the demodulated signal to an error processing system 112, which generates a digital error signal based on the demodulated signal and an input signal from the baseband module 102, as described in greater detail below. The transmitter 100 may be realized for use in a mobile device application, such as a cellular telephone that operates in accordance with a communications standard, such as, for example, the global system for mobile communications (GSM), wideband code division multiple access (WCDMA), long term evolution (LTE) standards, worldwide interoperability for microwave access (WiMax), or another suitable communications standard.

It should be understood that FIG. 1 is a simplified representation of a transmitter 100 for purposes of explanation and ease of description, and that practical embodiments may include other devices and components for providing additional functions and features, and/or the transmitter 100 may be part of a transceiver or a larger system, as will be understood. Various implementation aspects of RF transmitters are well known and so, in the interest of brevity, many conventional steps or elements will only be mentioned briefly herein or will be omitted entirely without providing the well known details.

In an exemplary embodiment, the baseband module 102 is coupled to the output control module 104 which, in turn, is coupled to the transmission module 106. The transmission module 106 generates an RF output signal by modifying and amplifying an input signal from the output control module 104 and provides the RF output signal to the antenna 108 for RF transmission. The RF directional coupler 109 is coupled to the output of the transmission module 106 and produces a coupled component of the RF output signal in a conventional manner. The demodulation module 110 is coupled to the output of the RF directional coupler 109. The error processing system 112 is coupled to the demodulation module 110 and the baseband module 102, and the error processing system 112 is configured to generate an input signal based on a difference between the signal from the baseband module 102 and the signal from the demodulation module 110, as described in greater detail below. The error processing system 112 is coupled to the output control module 104, which generates an input signal for the transmission module 106 based on the baseband input signal and the digital error signal, as described below.

In an exemplary embodiment, the baseband module 102 generates or otherwise provides baseband input signals to the output control module 104 and the error processing system 112. In an exemplary embodiment, the baseband input signals are digital signals which contain information to be transmitted by the transmitter 100, as will be appreciated in the art. In an exemplary embodiment, the output control module 104 adjusts the baseband input signal based on the digital error signal received from the error processing system 112 such that the output control module 104 compensates for any non-linearity of the transmission module 106.

In an exemplary embodiment, the output control module 104 includes an adaptive predistortion control module 114 and a power control module 116. The adaptive predistortion control module 114 is coupled to the baseband module 102 and the error processing system 112. The adaptive predistortion control module 114 applies predistortion to the baseband input signal for purposes of effectively linearizing the transmission module 106, as will be appreciated in the art. For example, the adaptive predistortion control module 114 may adjust the phase characteristics of the baseband input signal based on the digital error signal. Although not illustrated, the adaptive predistortion control module 114 may be realized or implemented with a general purpose processor, a digital signal processor, an application specific integrated circuit, a field programmable gate array, any suitable programmable logic device, discrete gate or transistor logic, discrete hardware components, or any combination thereof, designed to perform the functions described herein. In the case of complex baseband signals, the adaptive predistortion control module 114 may also include complex multipliers in the forward signal path, as will be appreciated in the art.

In an exemplary embodiment, the power control module 116 is coupled between the adaptive predistortion control module 114 and the transmission module 106. The power control module 116 is coupled to the error processing system 112 and adjusts the signal level of the baseband input signal such that power output of the transmission module 106 accurately reflects and/or tracks a desired and/or commanded power level derived from the baseband input signal, as will be appreciated in the art. In an exemplary embodiment, the adaptive predistortion control module 114 may be realized or implemented with a general purpose processor, a digital signal processor, an application specific integrated circuit, a field programmable gate array, any suitable programmable logic device, discrete gate or transistor logic, discrete hardware components, or any combination thereof, designed to perform the functions described herein. Although not illustrated, the power control module 116 may also include real multipliers in the forward signal path, as will be appreciated in the art.

It should be appreciated that FIG. 1 depicts one exemplary arrangement of elements, and in alternative embodiments, the output control module 104 may include only the adaptive predistortion control module 114 or only the power control module 116. Furthermore, in some embodiments, the adaptive predistortion control module 114 and power control module 116 may be integral as part of the same module, device, or package, as will be appreciated in the art.

In an exemplary embodiment, the transmission module 106 generates a RF output signal based on the adjusted baseband input signal received from the output control module 104. In an exemplary embodiment, the transmission module 106 may include a transmit modulator 118 configured to modulate the baseband input signal to a carrier frequency for transmission via antenna 108 in a conventional manner. Although not illustrated, transmission module 106 and/or transmit modulator 118 may include various additional components, such as digital signal processing elements, multiplexers, mixers, digital-to-analog converters, filters and/or other elements for processing the adjusted baseband input signal and converting the adjusted baseband input signal to an analog input signal prior to modulation, as will be appreciated in the art.

In an exemplary embodiment, the transmission module 106 includes a power amplifier 120 coupled between the transmit modulator 118 and the antenna 108 for amplifying the RF-modulated output signal prior to transmission. In practice, the power amplifier 120 may exhibit non-linear phase response and/or gain across the passband. The demodulation module 110 is coupled to the output of the power amplifier 120 and generates a baseband analog output signal based on the RF output signal from the power amplifier 120. In this regard, although not illustrated, the demodulation module 110 may include mixers, oscillators, filters, and/or various combinations thereof suitably configured to perform the functions described herein. As described below, the error processing system 112 generates a digital error signal based on the difference between the baseband analog output signal and the baseband input signal. The output control module 104 (e.g., the adaptive predistortion control module 114 or power control module 116) utilizes the digital error signal to compensate for the nonlinearity of the power amplifier 120 such that, in effect, the transmitter 100 operates linearly, as will be appreciated in the art.

In an exemplary embodiment, the error processing system 112 is configured to generate a digital reference signal based on the baseband input signal and convert the digital reference signal to an analog reference signal. The error processing system 112 produces an analog difference signal (or analog error signal) based upon the difference between the analog reference signal and the analog output signal, and generates the digital error signal based on the analog difference signal. In this regard, the error processing system 112 generates the digital error signal by converting the difference signal to a digital error value and digitally processing the digital error value as described below. Although not illustrated, in practice, the error processing system 112 may be integral with the output control module 104.

Figure 2:
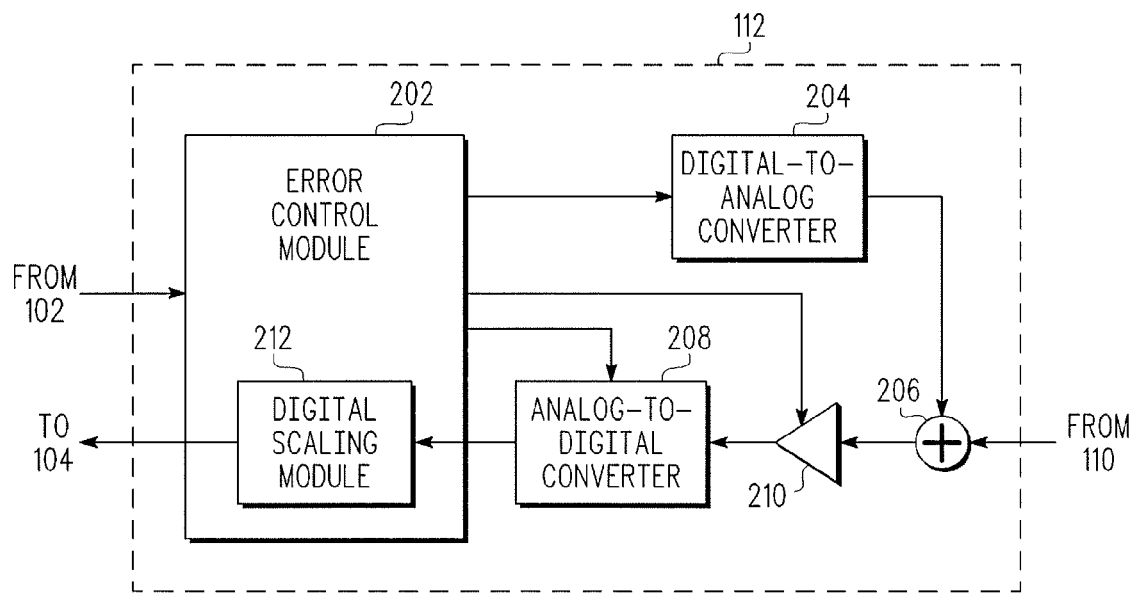
FIG. 2 is a block diagram of an error processing system suitable for use in the transmitter of FIG. 1 in accordance with one embodiment of the present invention.

Referring now to FIG. 2, an error processing system 112 suitable for use in the transmitter 100 of FIG. 1 includes, without limitation, a error control module 202, an digital-to-analog converter 204 (DAC), an analog summing element 206, and an analog-to-digital converter 208 (ADC). In an exemplary embodiment, the error processing system 112 includes a variable gain amplifier 210 and digital scaling module 212 cooperatively configured to allow a low resolution ADC achieve the desired dynamic range and resolution of the output signal from the analog summing element 206, as described in greater detail below. It should be understood that FIG. 2 is a simplified representation of an error processing system 112 for purposes of explanation and ease of description, and that practical embodiments may include other devices and components for providing additional functions and features.

In an exemplary embodiment, the error control module 202 is coupled to a baseband module (e.g., baseband module 102) or is otherwise configured to receive a baseband input signal. The DAC 204 is coupled to the error control module 202, and the DAC 204 converts a digital reference signal from the error control module 202 to an analog signal as described below. The analog summing element 206 is coupled to the analog output of the DAC 204. The analog summing element 206 is also coupled to the output of a demodulation module (e.g., demodulation module 110) or otherwise configured to receive an analog output signal that is indicative of the message signal being transmitted by a transmitter (e.g., transmitter 100). The output of the analog summing element 206 is coupled to the ADC 208, which is configured to convert the output of the analog summing element 206 to a digital signal, as described below. The digital output of the ADC 208 is coupled to the error control module 202 which, in turn, is coupled to an output control module (e.g., output control module 104, adaptive predistortion control module 114, or power control module 116) and generates and/or provides a digital error signal based on the digital signal from the ADC 208 to the output control module, as described below.

In an exemplary embodiment, the error control module 202 may be implemented or realized with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. In this regard, the error control module 202 may be realized as a microprocessor, a controller, a microcontroller, a state machine, or the like. The error control module 202 may also be implemented as a combination of computing devices, e.g., a combination of a digital signal processor and a microprocessor, a plurality of microprocessors, one or more microprocessors in conjunction with a digital signal processor core, or any other such configuration. In practice, error control module 202 includes processing logic that may be configured to carry out the functions, techniques, and processing tasks associated with the operation of the error processing system 112, as described in greater detail below. Furthermore, the steps of a method or algorithm described in connection with the embodiments disclosed herein may be embodied directly in hardware, in firmware, in a software module executed by error control module 202, or in any practical combination thereof.

In an exemplary embodiment, the variable gain amplifier 210 is coupled between the analog summing element 206 and the ADC 208. Depending on the embodiment, the analog summing element 206 may be realized using voltage summation, current summation, or another suitable method, as will be appreciated in the art. The variable gain amplifier 210 is coupled to the error control module 202 and amplifies the analog signal from the analog summing element 206 by a gain factor in response to a control command and/or control voltage determined by the error control module 202, as described below. The digital scaling module 212 is coupled to the output of the ADC 208 and is configured to adjust the digital signal from the ADC 208 in a manner that compensates for the gain of the variable gain amplifier 210, as described below. Depending on the embodiment, the digital scaling module 212 may be realized as a separate component, or the digital scaling module 212 may be integral with the error control module 202 as shown in FIG. 2.

As described below, in an exemplary embodiment, the ADC 208 is has a lower resolution and/or number of bits than the DAC 204, but the error processing system 112 is configured to achieve a resolution and/or dynamic range equivalent to that of the DAC 204, as described in greater detail below. Depending on the embodiment, the ADC 208 may be realized as a flash converter (or flash ADC), a folding ADC (or folded ADC), or another suitable ADC architecture having low latency. In this regard, the ADC 208 may be realized as an integrated circuit or comprise a suitably configured arrangement of resistors, comparators, capacitors, and/or transistors, as will be appreciated in the art.

Figure 3:
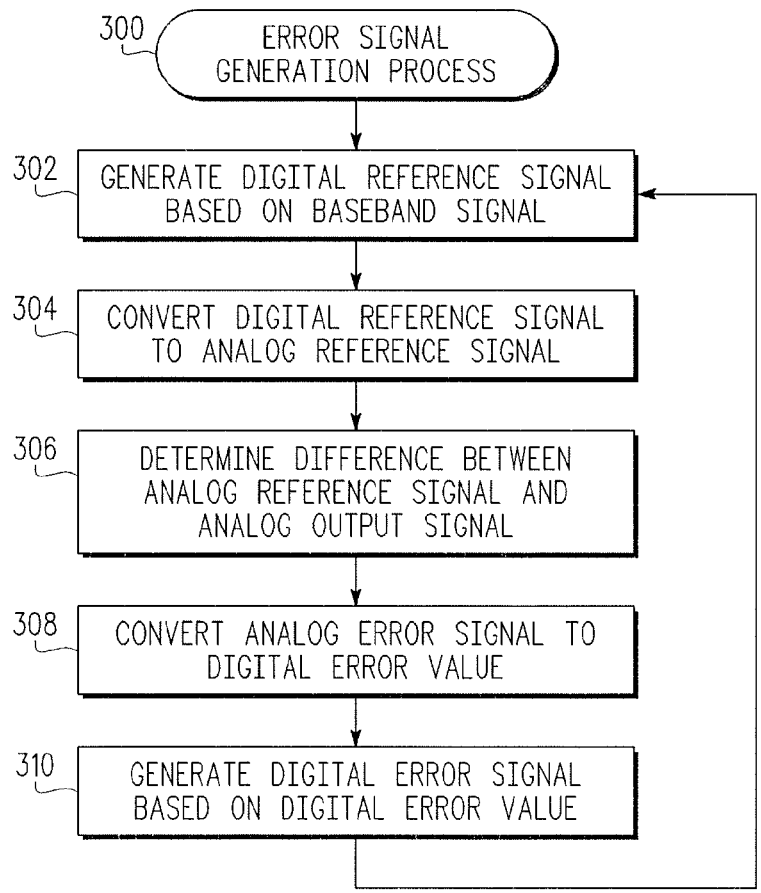
FIG. 3 is a flow diagram of an error signal generation process in accordance with one embodiment of the present invention.

Referring now to FIG. 3, in an exemplary embodiment, a transmitter 100 and/or error processing system 112 may be configured to perform an error signal generation process 300 and additional tasks, functions, and operations described below. The various tasks may be performed by software, hardware, firmware, or any combination thereof For illustrative purposes, the following description may refer to elements mentioned above in connection with FIG. 1 and FIG. 2. In practice, the tasks, functions, and operations may be performed by different elements of the described system, such as the baseband module 102, the error processing system 112, demodulation module 110, the error control module 202, the DAC 204, the analog summing element 206, the ADC 208, the variable gain amplifier 210, or the digital scaling module 212. It should be appreciated that any number of additional or alternative tasks may be included, and may be incorporated into a more comprehensive procedure or process having additional functionality not described in detail herein.

Referring to FIG. 3, and with continued reference to FIG. 1 and FIG. 2, a transmitter 100 and/or error processing system 112 may initialize the error signal generation process 300 when the transmitter 100 begins operation. In an exemplary embodiment, the error signal generation process 300 begins by determining a digital reference signal based on the baseband input signal (task 302). For example, the error control module 202 may receive an IQ baseband signal and determine a digital reference signal representative of the desired (or ideal) transmitter output in response to the baseband signal. In an exemplary embodiment, the error control module 202 generates a digital reference signal having a desired resolution or number of bits for the transmitter output controls (e.g., the adaptive predistortion control module 114 or power control module 116). For example, depending on the embodiment, the error control module 202 may generate a digital reference signal comprising 10 or 12 bits.

In an exemplary embodiment, the error signal generation process 300 continues by converting the digital reference signal to an analog reference signal (task 304). In this regard, the DAC 204 converts the digital reference signal to an analog reference signal. The DAC 204 is preferably configured for the same resolution and/or number of bits as the digital reference signal. In an exemplary embodiment, the error signal generation process 300 continues by determining, in the analog domain, the difference between the analog reference signal and an analog output signal representative of the transmitter output (task 306). In accordance with one embodiment, the analog summing element 206 is coupled to the output of the DAC 204 and the demodulation module 110, and the analog summing element 206 is configured to generate and/or produce an analog error signal in response to a difference between the analog reference signal from the DAC 204 and the analog output signal from the demodulation module 110.

In an exemplary embodiment, the error signal generation process 300 continues by converting the analog error signal (or analog difference) to a digital error value (task 308). For example, the ADC 208 may generate the digital error value by converting the analog error signal into a digital error value. In an exemplary embodiment, the ADC 208 has a lower resolution or lower number of bits than the DAC 204. For example, depending on the embodiment, the ADC 208 may comprise 4 or 5 bits while the DAC 204 (or digital reference signal) comprises 10 or 12 bits. As described in greater detail below, in an exemplary embodiment, the error signal generation process 300 generates a digital error signal having the same resolution and/or number of bits as the digital reference signal by digitally processing the digital error value (task 310).

In accordance with one embodiment, in order to achieve greater dynamic range and/or bit resolution with an ADC 208 having lower resolution relative to the digital reference signal and/or digital error signal, the error signal generation process 300 is configured to amplify the analog error signal by a gain factor prior to converting the analog error signal to the digital error value (tasks 306, 308). In this regard, the variable gain amplifier 210 may amplify (or attenuate depending on the gain factor) the analog error signal at the output of the analog summing element 206 prior to the ADC 208. As described below, the error control module 202 and/or digital scaling module 212 adjusts the digital error signal in a manner that compensates for the gain factor of the variable gain amplifier 210.

In accordance with one embodiment, the error control module 202 is configured to determine and/or adjust the gain factor of the variable gain amplifier 210 based on the digital error value (or the output of the ADC 208). For example, in an exemplary embodiment, the variable gain amplifier 210 has three different gain stages or levels, each having a different gain factor (e.g., −12 dB, −6 dB, and +6 dB). It will be appreciated in the art that by virtue of the closed-loop feedback system of FIG. 1 and FIG. 2, the analog error signal and/or digital error value that is generated will be largest when the error signal generation process 300 and/or transmitter 100 is initialized, and during operation will gradually converge towards a smaller value. In an exemplary embodiment, the error control module 202 and/or variable gain amplifier 210 are configured such that the gain factor of the variable gain amplifier 210 is initially in its lowest state (e.g., state '1' or −12 dB). If the digital error value and/or output of the ADC 208 is less than or equal to a lower threshold value, the error control module 202 may be configured to increase the gain factor of the variable gain amplifier 210 such that the analog error signal is resolvable by the ADC 208. For example, a binary value comprising only the least significant bit (e.g., 0001 for a 4-bit ADC) may be used as a lower threshold value. If the output of the ADC 208 is equal to or less than the threshold value (e.g., 0000 or 0001), the error control module 202 may increase the gain factor of the variable gain amplifier 210 to the next highest state (e.g., state '2' or −6 dB). In an exemplary embodiment, the error control module 202 continually monitors the output of the ADC 208, and depending on the number of gain states of the amplifier 210, the error control module 202 may dynamically adjust the gain of the variable gain amplifier 210 until the highest gain state is reached.

Similarly, in order to prevent saturation of the ADC 208, the error control module 202 may be configured to decrease the gain factor of the variable gain amplifier 210 if the digital error value and/or output of the ADC 208 is greater than or equal to an upper threshold value. For example, a binary value equal to full scale (e.g., 1111 for a 4-bit ADC) or full scale minus the least significant bit (e.g., 1110 for a 4-bit ADC) may be used as an upper threshold value. If the output of the ADC 208 is equal to or greater than the threshold value (e.g., 1111), the error control module 202 may decrease the gain factor of the variable gain amplifier 210 to the next lowest state (e.g., from state '3' to state '2' or from +6 dB to −6 dB). In this regard, the error control module 202 may dynamically adjust the gain factor of the variable gain amplifier 210 during operation (e.g., by increasing and/or decreasing the gain based on the ADC 208 output) to improve the dynamic range and prevent saturation of the ADC 208.

In an exemplary embodiment, the error control module 202 and/or digital scaling module 212 generates the digital error signal based on the digital error value in a manner that compensates for the gain factor of the variable gain amplifier 210 (task 310). For example, the error control module 202 and/or digital scaling module 212 may increase the number of bits of the digital error value such that the digital error value has the same number of bits as the digital reference signal, and then adjust the digital error value based on the gain of the variable gain amplifier 210. In an exemplary embodiment, the error control module 202 and/or digital scaling module 212 scales the digital error value by an inverse of the gain factor. For example, if the gain factor of the variable gain amplifier 210 is +6 dB, which corresponds to a voltage level approximately twice the 0 dB voltage level, the error control module 202 and/or digital scaling module 212 scales the digital error value by a factor of one half (e.g., a binary shift to the right one bit). Conversely, if the gain factor of the variable gain amplifier 210 is −6 dB, which corresponds to a voltage level approximately one half of the 0 dB voltage level, the error control module 202 and/or digital scaling module 212 scales the digital error value by a factor of two (e.g., a binary shift to the left one bit). It will be appreciated in the art that bit shifting is merely one exemplary method for adjusting the digital error value, and in practice, other suitable methods for adjusting the digital error value may be used, such as, for example, multiplication or scaling (e.g., using multiplier circuitry), or another suitable method for adjusting a digital value. In this manner, the effective resolution of the ADC 208 is increased by dynamically adjusting the gain of the variable gain amplifier 210 based on the output of the ADC 208. As a result, the error signal generation process 300 may utilize a lower resolution ADC 208 to generate digital error signal having a higher number of bits, without compromising the dynamic range of the digital error signal.

In an alternative embodiment, the error signal generation process 300 may be configured to adjust the reference voltage used for the ADC 208 based on the digital error value (task 308). For example, the error control module 202 may be configured to adjust the reference voltage of the ADC 208 based on the digital error value in a manner similar to that described above with regards to the variable gain amplifier 210. The error control module 202 and/or digital scaling module 212 may then adjust the digital error value and generate the digital error signal in a manner that compensates for the change in the ADC 208 reference voltage (task 310), as will be appreciated in the art. The loop defined by tasks 302, 304, 306, 308, and 310 may repeat as desired throughout operation of the transmitter 100.

One advantage of the systems and/or methods described above is that a lower resolution ADC may be used to generate a digital error signal for adaptive predistortion or output power control methods without compromising the dynamic range of the digital error signal. By reducing the resolution of the ADC, the ADC can be realized using smaller, faster, and cheaper ADCs, which reduces the current and/or power required by the ADC. For example, conventional higher resolution ADCs may consume as much as 6.5 mA or more current, whereas the lower resolution ADCs allowable by virtue of this design may consume one milliamp (1 mA) or less. In addition to the significant current reduction, the area occupied by the ADC is also reduced. Although the systems described above introduce a higher resolution DAC, the overall current is reduced because DACs consume less current than ADCs of the same resolution, and any current increase on behalf of the DAC is exceeded by the reduction in the ADC current. Dynamically adjusting the amplifier gain and digital scaling increases the effective resolution of the ADC such that the transmitter control methods achieve equivalent performance metrics as prior art systems.

In summary, systems, devices, and methods configured in accordance with example embodiments of the subject matter relate to:

An apparatus is provided for an error processing system for determining an error signal based on an input signal and an analog output signal. In an exemplary embodiment, the error processing system comprises a module configured to determine a digital reference signal based on the input signal and a digital-to-analog converter coupled to the module and configured to convert the digital reference signal to an analog reference signal. The error processing system further comprises an analog summing element coupled to the digital-to-analog converter, wherein the analog summing element produces an analog error signal based upon a difference between the analog reference signal and the analog output signal. An analog-to-digital converter is coupled to the analog summing element and the module, and the analog-to-digital converter converts the analog error signal into a digital error value, wherein the error signal is generated based on the digital error value.

In accordance with one embodiment, the error processing system further comprises an amplifier coupled between the analog summing element and the analog-to-digital converter. The amplifier amplifies the analog error signal, wherein the module is coupled to the amplifier and configured to adjust a gain of the amplifier based on the digital error value. In a further embodiment, the module generates the error signal to compensate for the gain of the amplifier. In another embodiment, the error processing system further comprises a digital scaling module coupled to the analog-to-digital converter and the module, wherein the digital scaling module is configured to generate the error signal by increasing the number of bits of the digital error value such that the digital error value has the same number of bits as the digital reference signal, and adjusting the digital error value based on the gain of the amplifier. In yet another embodiment, the module is configured to increase the gain of the amplifier if the digital error value is less than a threshold value. In another embodiment, the module decreases the gain of the amplifier if the digital error value is greater than a threshold value. In accordance with one embodiment, the digital-to-analog converter has a first number of bits of resolution and the analog-to-digital converter has a second number of bits of resolution, wherein the second number of bits of resolution is less than the first number of bits of resolution. In an exemplary embodiment, the analog-to-digital converter selected from the group consisting of a flash converter and a folding ADC.

In another embodiment, a method for controlling the output of a transmitter that generates an analog output signal based on an input signal is provided. The method comprises generating a digital reference signal based on a baseband input signal, converting the digital reference signal to an analog reference signal, and generating an analog error signal in response to a difference between the analog reference signal and the analog output signal. The method further comprises generating a digital error signal from the analog error signal, and generating the input signal based on the baseband input signal and the digital error signal. In accordance with one embodiment, generating the digital error signal comprises converting the analog error signal to a digital error value, and scaling the digital error value to obtain the digital error signal. In another embodiment, the digital reference signal has a first number of bits and the digital error value has a second number of bits being less than the first number of bits, wherein scaling the digital error value comprises scaling the digital error value to obtain the digital error signal having the first number of bits.

In another embodiment, the method further comprises amplifying the analog error signal by a gain factor prior to converting the analog error signal to the digital error value. In a further embodiment, the method comprises determining the gain factor based on the digital error value. In accordance with one embodiment, determining the gain factor comprises increasing the gain factor if the digital error value is less than a first threshold value, and decreasing the gain factor if the digital error value is greater than a second threshold value. In yet another embodiment, generating the digital error signal based on the digital error value comprises increasing the number of bits of the digital error value such that the digital error value has the same number of bits as the digital reference signal, and scaling the digital error value by an inverse of the gain factor.

An apparatus is provided for a transmitter for generating a radio frequency output signal based on a baseband input signal. In an exemplary embodiment, the transmitter comprises an output control module configured to adjust the baseband input signal based on a digital error signal to produce an adjusted baseband input signal and a transmission module coupled to the output control module, wherein the transmission module generates the radio frequency output signal based on the adjusted baseband input signal. A demodulation module is coupled to the transmission module and generates an analog output signal based on the radio frequency output signal. An error processing system is coupled to the demodulation module and the output control module. The error processing system is configured to generate a digital reference signal based on the baseband input signal, convert the digital reference signal to an analog reference signal, produce a difference signal based upon a difference between the analog reference signal and the analog output signal, and generate the digital error signal based on the difference signal.

In accordance with one embodiment, the error processing system comprises a digital-to-analog converter configured to convert the digital reference signal to the analog reference signal, and an analog summing element coupled to the digital-to-analog converter, wherein the analog summing element produces the difference signal. In another embodiment, the error processing system is configured to generate the digital error signal by converting the difference signal to a digital error value, and digitally processing the digital error value. In yet another embodiment, the error processing system further comprises an analog-to-digital converter configured to generate the digital error value based on the difference signal. In a further embodiment, the error processing system is configured to amplify the difference signal by a gain factor prior to converting the difference signal to the digital error value, and generate the digital error signal based on the digital error value to compensate for the gain factor.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An error processing system for determining an error signal based on an input signal and an analog output signal, the error processing system comprising:
    a digital-to-analog converter having a first number of bits of resolution configured to convert a digital reference signal having the first number of bits to an analog reference signal;
    an analog summing element coupled to the digital-to-analog converter, the analog summing element being configured to produce an analog error signal based upon a difference between the analog reference signal and the analog output signal;
    a variable gain amplifier coupled to the analog summing element, the variable gain amplifier being configured to amplify the analog error signal by a gain;
    an analog-to-digital converter coupled to the variable gain amplifier, the analog-to-digital converter having a second number of bits of resolution to convert the analog error signal into a digital error value having the second number of bits, wherein the second number of bits is less than the first number of bits; and
    a module coupled to the digital-to-analog converter and the analog-to-digital converter, wherein the module is configured to:
        determine the digital reference signal based on the input signal;
        generate the error signal having the first number of bits based on the digital error value in a manner that compensates for the gain of the variable gain amplifier; and
        adjust the gain of the variable gain amplifier based on the digital error value.

2. The error processing system of claim 1, wherein the analog-to-digital converter is selected from the group consisting of a flash converter and a folded analog-to-digital converter.

3. The error processing system of claim 1, wherein the module includes a digital scaling module coupled to the analog-to-digital converter, wherein the digital scaling module is configured to generate the error signal by:
    increasing the number of bits of the digital error value such that the digital error value has the first number of bits; and
    shifting bits of the digital error value based on the gain of the variable gain amplifier.

4. The error processing system of claim 1, wherein the module is configured to decrease the gain of the variable gain amplifier when the digital error value is greater than an upper threshold value.

5. The error processing system of claim 4, wherein the module is configured to increase the gain of the variable gain amplifier when the digital error value is less than a lower threshold value.

6. The error processing system of claim 1, wherein the module is configured to generate the error signal by scaling the digital error value by an inverse of the gain.

7. The error processing system of claim 1, wherein the module is configured to generate the error signal by shifting bits of the digital error value based on the gain.

8. A method for controlling the output of a transmitter that generates an analog output signal based on an input signal, the method comprising:
    generating a digital reference signal having a first number of bits based on a baseband input signal;
    converting the digital reference signal to an analog reference signal;
    generating an analog error signal in response to a difference between the analog reference signal and the analog output signal;
    amplifying the analog error signal by a gain factor prior to converting the analog error signal to a digital error value;
    converting the analog error signal to the digital error value having a second number of bits, the second number of bits being less than the first number of bits;
    generating a digital error signal having the first number of bits by adjusting the digital error value to compensate for the gain factor; and
    generating the input signal based on the baseband input signal and the digital error signal.

9. The method of claim 8, further comprising determining the gain factor based on the digital error value.

10. The method of claim 9, wherein determining the gain factor comprises:
    increasing the gain factor if the digital error value is less than a first threshold value; and
    decreasing the gain factor if the digital error value is greater than a second threshold value.

11. The method of claim 8, wherein generating the digital error signal comprises increasing the number of bits of the digital error value such that the digital error value has the same number of bits as the digital reference signal prior to scaling the digital error value.

12. A transmitter for generating a radio frequency output signal based on a baseband input signal, the transmitter comprising:
    an output control module configured to adjust the baseband input signal based on a digital error signal to produce an adjusted baseband input signal;
    a transmission module coupled to the output control module, the transmission module being configured to generate the radio frequency output signal based on the adjusted baseband input signal;
    a demodulation module coupled to the transmission module, the demodulation module being configured to generate an analog output signal based on the radio frequency output signal; and an error processing system coupled to the demodulation module and the output control module, the error processing system being configured to:
  generate a digital reference signal having a first number of bits based on the baseband input signal;
  convert the digital reference signal to an analog reference signal;
  produce a difference signal based upon a difference between the analog reference signal and the analog output signal;
  amplify the difference signal by a gain factor;
  convert the difference signal to a digital error value having a second number of bits after amplifying the difference signal by the gain factor, the second number being less than the first number;
  adjust the digital error value by an inverse of the gain factor to obtain the digital error signal having the first number of bits; and
  adjust the gain factor based on the digital error value.

13. The transmitter of claim 12, wherein the error processing system comprises:
  a digital-to-analog converter configured to convert the digital reference signal to the analog reference signal; and
  an analog summing element coupled to the digital-to-analog converter, the analog summing element being configured to produce the difference signal.

14. The transmitter of claim 13, further comprising an analog-to-digital converter coupled to the analog summing element to convert the difference signal to the digital error value, wherein:
  the digital-to-analog converter has the first number of bits of resolution;
  the analog-to-digital converter has the second number of bits of resolution; and
  the error processing system is configured to scale the digital error value by:
    increasing a number of bits of the digital error value to be the same as a number of bits of the digital reference signal; and
    shifting bits of the digital error value based on the inverse of the gain factor to obtain the digital error signal.

15. An error processing system for determining an error signal based on an input signal and an analog output signal, the error processing system comprising:
  a digital-to-analog converter configured to convert a digital reference signal to an analog reference signal;
  an analog summing element coupled to the digital-to-analog converter, the analog summing element being configured to produce an analog error signal based upon a difference between the analog reference signal and the analog output signal;
  a variable gain amplifier coupled to the analog summing element, the variable gain amplifier being configured to amplify the analog error signal by a gain;
  an analog-to-digital converter coupled to the variable gain amplifier, the analog-to-digital converter being configured to convert the analog error signal into a digital error value; and
  a module coupled to the digital-to-analog converter and the analog-to-digital converter, wherein the module is configured to:
    determine the digital reference signal based on the input signal;
    generate the error signal based on the digital error value by scaling the digital error value by an inverse of the gain to compensate for the gain of the variable gain amplifier; and
    adjust the gain of the variable gain amplifier based on the digital error value.

16. A transmitter for generating a radio frequency output signal based on a baseband input signal, the transmitter comprising:
  an output control module configured to adjust the baseband input signal based on a digital error signal to produce an adjusted baseband input signal;
  a transmission module coupled to the output control module, the transmission module being configured to generate the radio frequency output signal based on the adjusted baseband input signal;
  a demodulation module coupled to the transmission module, the demodulation module being configured to generate an analog output signal based on the radio frequency output signal; and
  an error processing system coupled to the demodulation module and the output control module, the error processing system comprising:
  a digital-to-analog converter having a first number of bits of resolution to convert a digital reference signal to an analog reference signal;
  an analog summing element coupled to the digital-to-analog converter to produce a difference signal based upon a difference between the analog reference signal and the analog output signal; and
  an analog-to-digital converter coupled to the analog summing element to convert the difference signal to a digital error value, the analog-to-digital converter having a second number of bits of resolution being less than the first number of bits of resolution, wherein the error processing system is configured to:
  generate the digital reference signal based on the baseband input signal;
  amplify the difference signal by a gain factor prior to converting the difference signal to the digital error value;
  increase a number of bits of the digital error value to be the same as a number of bits of the digital reference signal;
  shift bits of the digital error value based on an inverse of the gain factor to obtain the digital error signal; and
  adjust the gain factor based on the digital error value.

* * * * *